(12) United States Patent
Payakapan et al.

(10) Patent No.: US 7,761,755 B1
(45) Date of Patent: Jul. 20, 2010

(54) CIRCUIT FOR AND METHOD OF TESTING FOR FAULTS IN A PROGRAMMABLE LOGIC DEVICE

(75) Inventors: Tassanee Payakapan, Toronto (CA); Ismed D. Hartanto, Castro Valley, CA (US); Shahin Toutounchi, Pleasanton, CA (US)

(73) Assignee: XILINX, Inc., San Jose, CA (US)

( * ) Notice: Subject to any disclaimer, the term of this patent is extended or adjusted under 35 U.S.C. 154(b) by 726 days.

(21) Appl. No.: 11/707,360

(22) Filed: Feb. 16, 2007

(51) Int. Cl.
*G01R 31/28* (2006.01)
*G11B 27/00* (2006.01)
*H03M 13/00* (2006.01)

(52) U.S. Cl. .................... 714/724; 714/814; 713/500

(58) Field of Classification Search .............. None
See application file for complete search history.

(56) References Cited

U.S. PATENT DOCUMENTS 7,036,095 B2 * 4/2006 Pavesi et al. ............. 716/1
7,068,068 B2 * 6/2006 Nazarian .................. 326/37
7,228,476 B2 * 6/2007 Scipioni et al. ........... 714/733

OTHER PUBLICATIONS

Beck, Matthias et al., "Logic Design for On-Chip Test Clock Generation—Implementation Details and Impact on Delay Test Quality", 2005, 6 pgs., IEEE, 3 Park Avenue 17th Floor, New York, NY 10016-5997.

* cited by examiner

*Primary Examiner*—Christine T Tu
(74) *Attorney, Agent, or Firm*—John J. King

(57) ABSTRACT

A circuit may be used for testing for faults in a programmable logic device. The circuit may include a clock generator coupled to receive a reference clock signal and generate a high speed clock signal; a circuit under test coupled to receive selected pulses of the high speed clock signal; and a programmable shift register coupled to receive a pulse width selection signal and generate an enable signal for selecting the pulses the high speed clock signal, wherein the pulse width of the enable signal is selected based upon the value of the pulse width selection signal. A method of testing for faults in a programmable logic device is also disclosed.

20 Claims, 5 Drawing Sheets

CIRCUIT FOR AND METHOD OF TESTING FOR FAULTS IN A PROGRAMMABLE LOGIC DEVICE

FIELD OF THE INVENTION

The present invention relates generally to programmable logic devices, and in particular, to a circuit for and a method of testing for faults in a programmable logic device.

BACKGROUND OF THE INVENTION

As process technologies for integrated circuits continue to improve, leading to smaller devices, faults in the integrated circuit which result from manufacturing defects have become more of a concern. For example, speed-related defects have become a more significant problem in integrated circuits having transistors with gate widths of 90 nm or smaller. A resistive via defect or a resistive bridge defect between two neighboring metal lines may cause a transition delay fault. A transition delay fault refers to a gate or a path that fails to meet timing requirements due to a manufacturing defect. In contrast, a "stuck-at" fault refers to a gate or path which is shorted to a certain voltage potential. Unlike a "stuck-at" fault which may be detected by the appropriate application of vectors and the observation of outputs, transition delay faults have an added requirement of an at-speed test, where test signals are applied at the operating speed of the device. That is, the transition delay fault testing is a variation of the "stuck-at" fault testing in which there is an additional restriction of speed. As the operating speeds of the devices under test continue to increase, the speeds of high speed signals used in at-speed testing have also increased.

Transition delay fault testing aims to identify faults related to slow-to-rise and slow-to-fall transitions of signals. One possible cause for a slow-to-rise or a slow-to-fall transition is a resistive bridge fault that slows down the transition time of a transistor gate, although the correct value is eventually produced. While transition delay faults are assumed to be relatively large and localized to a single site, a test of the path delay is performed under the assumption that the delays are small and distributed across a circuit or chip. A test for the path delay will test the cumulative delay across an entire path, and usually of critical paths. The problem with a path-delay test is that identifying the paths is not easy, and usually results in only a small number of paths. However, a transition delay fault model will test many paths in a net-list. Further, at-speed types of faults such as transition delay faults are usually not detected with conventional low speed tests. In addition, many such transition delay faults become future "reliability" failures. That is, a device that starts out with a marginal or timing related defect may turn into a hard failure in the field. Therefore, testing for speed-related defects such as transition delay faults has become increasingly important.

One method of catching speed-related defects is to run the conventional tests at high speed. However, the application of at-speed tests to integrated circuits has a number of practical problems. The test hardware used to test the integrated circuit has to reliably apply and sample the vectors at a very high speed, thereby increasing the cost of the tester compared to a conventional low speed tester. Further, the high-speed application of vectors also results in high current consumption, often causing the device under test to heat up. However, it is not very practical to employ sophisticated heat sinks in the test environment.

While the problems associated with at-speed testing are well recognized by industry, the solutions for at-speed testing have many deficiencies. Manufacturers of application specific integrated circuits (ASICs) have employed several approaches to at-speed testing. For example, built-in self-test (BIST) circuitry that internally applies the vectors and compresses the outputs has been used. While the interface between the tester and device will be slow, the device will be tested at very high speed. However, BIST circuitry tends to be difficult to implement, while also requiring additional silicon area of the integrated circuit. Further, testing using a BIST approach is not deterministic. That is, BIST techniques involve applying pseudo-random test vectors which do not target specific faults.

Another conventional approach uses Automated Test Pattern Generation (ATPG) and "scan test" circuits to deliver a series of closely spaced pulses to test for transition delay faults. While functional simulations may be used to verify the operation of a design, it is difficult and time consuming to produce enough simulations to provide high fault coverage. A circuit undergoing a scan test goes through an at-speed transition by use of launch and capture cells, as is well known in the art. The use of scan test circuits, as will be described in more detail below in reference to FIG. 5, simplifies test-pattern generation by reducing the design, or sections of a design, into purely combinational logic. Fast and efficient algorithms in ATPG tools developed for combinational logic may be used to generate high-fault-coverage vectors. While closely spaced pulses are used in a scan test to create the at-speed test environment, the average power consumption is kept low because closely spaced pulses are sparse. However, intellectual property (IP) cores of programmable logic devices are commonly tested using industry-standard "stuck-at" ATPG vectors applied using scan test circuits.

Accordingly, there is a need for an improved circuit for and a method of testing for faults in a programmable logic device.

SUMMARY OF THE INVENTION

A circuit for testing for faults in a programmable logic device is disclosed. The circuit comprises a clock generator coupled to receive a reference clock signal and generate a high speed clock signal; a circuit under test coupled to receive selected pulses of the high speed clock signal; a programmable shift register coupled to receive a pulse width selection signal and generate an enable signal for selecting pulses of the high speed clock signal, wherein pulse width of the enable signal is selected based upon the value of the pulse width selection signal. According to one embodiment of the invention, the programmable shift register may be implemented in programmable logic of the programmable logic circuit.

According to an alternate embodiment, a circuit for testing for faults in a programmable logic device comprises a clock generator coupled to receive a reference clock signal and generate a high speed clock signal; a circuit under test coupled to receive a number of selected pulses of the high speed clock signal; and a programmable logic circuit generating an enable signal for selecting the selected pulses of the high speed clock coupled to the circuit under test, wherein the programmable logic circuit is reprogrammed after the circuit under test has been tested. The programmable logic circuit may enable a scan-based test to be performed on the programmable logic device, wherein the scan-based test is performed at the operating speed of the programmable logic device. Further, the circuit under test may comprise at least a portion of the programmable logic device.

A method of testing the functionality of a programmable logic device is also disclosed. The method comprises generating a high speed clock signal based upon a reference clock signal; generating a programmable enable signal for selecting pulses of the high speed clock signal by way of a programmable logic circuit of the programmable logic device; testing the programmable logic device using the high speed clock signal to detect defects; and reprogramming the programmable logic circuit of the programmable logic device after the step of testing. The method may further comprise selecting one of a plurality of high speed clock signals. Defects in the programmable logic device may be detected by implementing a scan-based test of the programmable logic device, or a transition delay fault may be identified by implementing a scan-based test of the programmable logic device using the high speed clock.

DETAILED DESCRIPTION OF THE DRAWINGS

Figure 1:
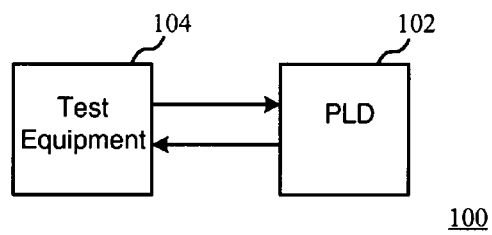
FIG. 1 is a block diagram of a circuit for testing for faults in a programmable logic device according to an embodiment the present invention.

Turning first to FIG. 1, a block diagram of a circuit 100 for testing for faults in a programmable logic device (PLD) according to an embodiment the present invention is shown. In particular, a PLD 102 is coupled to test equipment 104, which applies test vectors to and receives result vectors from the PLD 102. An example of test equipment which may be used in an embodiment of the present invention is the J750 Tester available from Teradyne, Inc. of Boston, Mass., although other suitable test equipment may be used. A PLD is designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. In some CPLDs, configuration data is stored on-chip in non-volatile memory, then downloaded to volatile memory as part of an initial configuration sequence.

Another type of PLD is a field programmable gate array (FPGA). In a typical FPGA, which will be described in more detail in reference to FIG. 6, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

Figure 2:
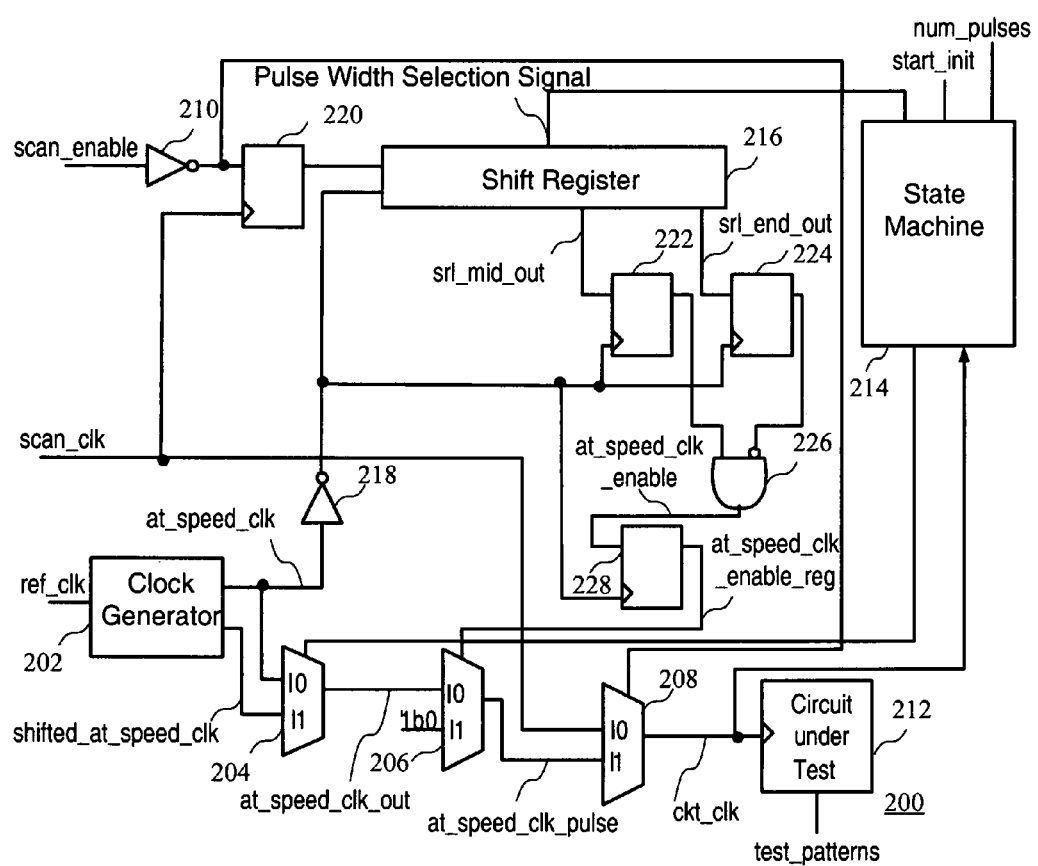
FIG. 2 is a more detailed block diagram of a circuit for testing for faults in a programmable logic device according to an embodiment of the present invention.

Turning now to FIG. 2, a more detailed block diagram of a circuit 200 for testing for faults in a programmable logic device according to an embodiment of the present invention is shown. In particular, a clock generator 202 receives a reference clock (ref_clk) and generates a plurality of clock signals, including an "at-speed" clock (at_speed_clk) and a shifted "at-speed" clock (shifted_at_speed_clk), each of which is coupled to a first stage multiplexer 204. Although two high speed clocks are shown, any number of high speed clocks may be generated. The shifted "at-speed" clock may be shifted by any phase, by a circuit such as a Phase-Locked Loop (PLL) or a digital clock manager as will be described in more detail in reference to FIG. 5. A second stage multiplexer 206 is coupled to receive the output of the multiplexer 204, and a zero signal. The control signal coupled to the control terminal of the multiplexer 206 will determine the length of time that a registered "at-speed" clock enable signal (at_speed_clk_enable_reg) is coupled to select an "at-speed" clock output by the clock generator, and therefore the number of pulses of the high speed clock which will be used in the scan based test, as will be described in more detail in reference to FIG. 3 below. Finally, the output of the multiplexer 206 is coupled to a third stage multiplexer 208, which is also coupled to receive the scan clock (scan_clk). The scan clock may be the clock applied by the test equipment to implement scan testing. An inverted scan enable signal (scan_enable) coupled to a control terminal of the multiplexer 208 by way of an inverter 210 is used to select whether the scan clock or a high speed clock is applied to the circuit under test 212 to receive test patterns.

A state machine 214 comprises a control circuit which couples a pulse width selection signal to a shift register 216 and which generates an at-speed clock enable signal. The state machine receives an initialization signal (start_init) which is used to set the pulse width of an at-speed clock enable signal to determine the number of at-speed clock pulses to be used in the testing. Before the test patterns, such as ATPG patterns, are applied to the circuit under test, start_init is pulled high to set up the correct number of at-speed pulses. Start_init is then driven low and the ATPG patterns are applied to the circuit under test. The number of pulses which are initially set is determined by a number of pulses (num_pulses) value which is provided to the state machine 214. The state machine will select the appropriate output of the shift register based upon the number of pulses value to generate the at-speed clock enable signal which produces the appropriate number of pulses. The state machine is also coupled to receive the circuit test clock (ckt_clk) applied to the circuit under test to determine whether the correct number of pulses is actually applied to the circuit under test. If not, the state machine will select a different output of the shift register to ensure that the appropriate number of pulses is generated. The state machine will also monitor the number of pulses value coupled to the state machine to determine whether a new value has been selected, enabling the dynamic selection of the number of pulses during testing of the circuit under test. The ability to use a high speed clock (at_speed_clk) or a phase-shifted high speed clock (shifted_at_speed_clk) is controlled by a multiplexer control signal coupled to the multiplexer 204 from the state machine to improve timing.

As will be described in more detail in reference to the programmable shift register of FIG. 4, the shift register 216 is clocked by an inverted clock signal output by an inverter 218 which is coupled to receive a clock generated by the clock generator 202. The shift register 216 is also coupled to receive the inverted scan enable signal at the output of the inverter 210 by way of a register 220. The inverted at-speed clock signal from inverter 218 is preferably used to clock the shift register in order to provide glitch-free switching from the at-speed clock to the scan clock. The signals srl_mid_out and srl_last_out output by the shift register and an at-speed clock enable (at_speed_clk_enable) signal are also preferably registered to allow the circuit to function properly at higher frequencies. Accordingly, the selected outputs of the shift register 216 are coupled to registers 222 and 224, respectively, each of which is also clocked by the clock signal at the output of the inverter 218. The output of the register 222 is coupled to a first input of an AND gate 226 and the output of the register 224 is coupled to an inverted input of the AND gate 226 to provide the rising and falling edges of a pulse signal which determines the number of at-speed pulses which may be coupled to the circuit under test. The output of the AND gate is coupled to a register 228, the output of which is coupled to control the multiplexer 206 for selecting either a high speed pulse or a zero signal.

Figure 3:
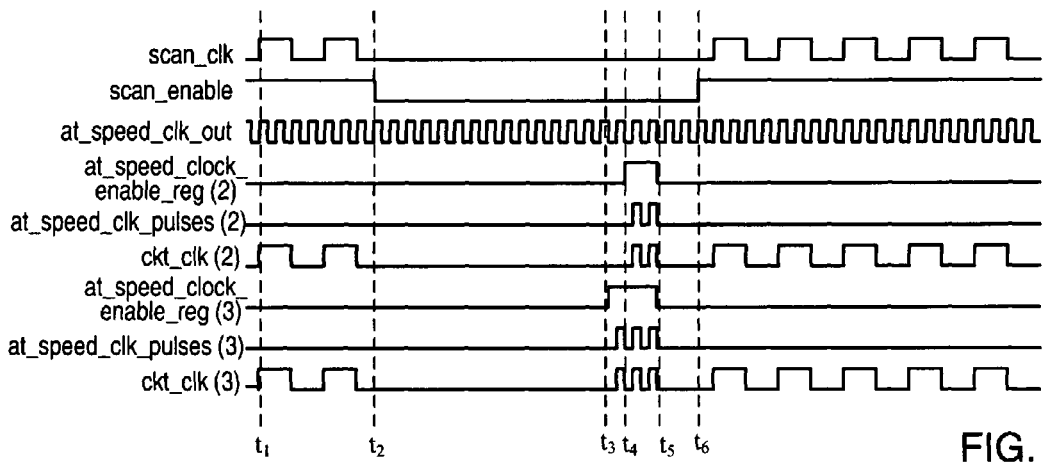
FIG. 3 is a timing diagram showing the operation of the circuit of FIG. 2 according to an embodiment of the present invention.

Turning now to FIG. 3, a timing diagram shows the operation of the circuit of FIG. 2 according to an embodiment of the present invention. As can be seen between times $t_1$ and $t_2$, the scan enable signal is high, enabling the scan clock to be selected at the output of the multiplexer 208. A registered at-speed clock enable signal (at_speed_clk_enable_reg) is coupled to the control terminal of the multiplexer 206 for selecting either an at-speed clock output by the multiplexer 204, or the zero signal. Two examples of a test clock signal (ckt_clk) having high speed pulses coupled to the circuit under test are shown between a time $t_3$ and $t_5$. In particular, the at_speed_clock_enable_reg (2) signal goes high at a time $t_a$ and then goes low again at a time $t_5$. During this period, two high speed clock pulses (at_speed_clk_pulses (2)) are selected to be applied to the circuit under test as the ckt_clk (2). In contrast, a second example of the registered at-speed clock enable signal (at_speed_clock_enable_reg (3)) enables three high speed clock pulses (at_speed_clk_pulses (3)) to be selected to be applied to the circuit under test as the ckt_clk (3) between times $t_3$ and $t_5$. As can be seen, at time $t_6$, the scan enable is again high, and therefore the scan clock is applied to the circuit under test. Accordingly, the pulse width of the registered at-speed clock enable signal, which selects either the high speed clock or a zero signal, and the scan enable signal which selects either the scan clock or the output of the multiplexer 206, enable the generation of a ckt_clk signal comprising a test clock which implements an at-speed scan based test.

Accordingly, in order to incorporate transition delay fault and path delay testing of IP cores using scan circuitry, the timing required would be to have a slow-speed clock for scan chain shifting and two or more high-speed clock pulses to test the at-speed transition by use of launch and capture. In order to achieve the highest fault coverage possible, the circuit of FIG. 2 enables a programmable number of at-speed clock pulses during capture. The circuit of FIG. 2 enables programmably generating two or more clock pulses using an FPGA for scan-based at-speed testing, including transition delay fault or path delay testing. The circuit of FIG. 2 creates a dynamic number of "at-speed" clock pulses during capture in a scan test to achieve higher fault coverage for transition and path delay testing, while minimizing the amount of FPGA fabric resources used. Generally, two pulses are used to check single cycle paths, but greater fault coverage may be achieved if ATPG tools pulse two or more times during capture to test sequential paths. As will be described in more detail in reference to FIG. 5, a digital clock manager (DCM) or a phase lock loop (PLL) may be used during testing to set up a high-speed clock necessary for transition delay fault and path delay testing. For example, a low-speed clock may be fed in from the test equipment to the DCM or the PLL which may be configured to generate the high-speed clock speed that is necessary for at-speed testing.

Figure 4:
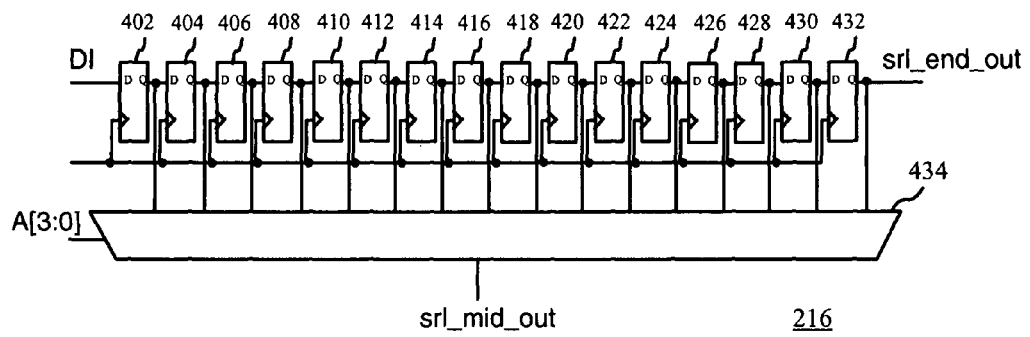
FIG. 4 is a block diagram of a programmable shift register according to an embodiment of the present invention.

Turning now to FIG. 4, a block diagram of a programmable shift register according to an embodiment of the present invention is shown. The shift register of FIG. 4 comprises sixteen registers 402-432 coupled to serially receive the input data (DI). The output of each of the registers is coupled to a multiplexer 434. The output srl_mid_out of the multiplexer is selected based upon a 4-bit input A[3:0] comprising a pulse width selection signal, and is therefore programmable depending on the value of A[3:0]. The other output, srl_last_out, is the value of the last shift register. The state machine 214 is used to generate the A[3:0] bits which are the selection inputs of the shift register. Both srl_mid_out and srl_last_out are used to create a signal at_speed_clk_enable described above, and particularly enable a variable number of at-speed clock pulses to enable scan testing. Note that in some embodiments, the shift register may be implemented as part of a lookup table (LUT) of a programmable logic device.

Figure 5:
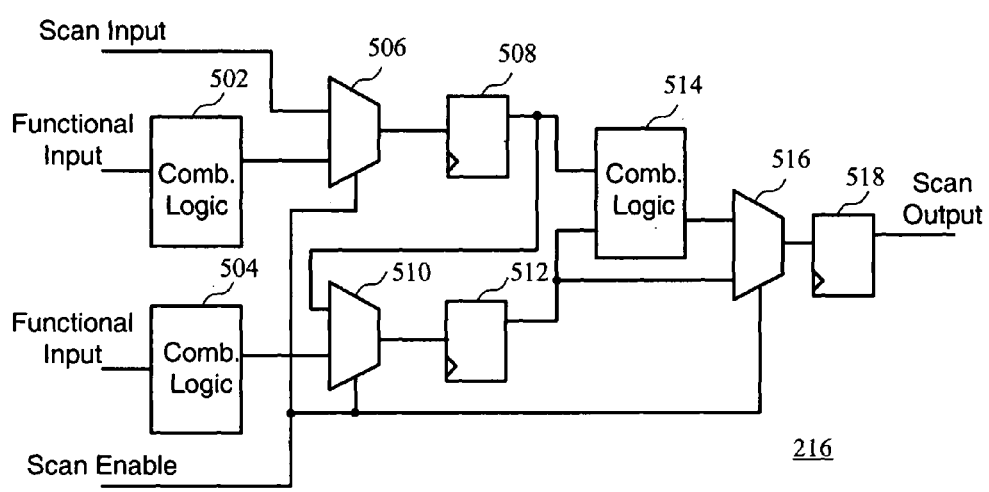
FIG. 5 is a block diagram of a circuit under test according to an embodiment of the present invention.

Turning now to FIG. 5, a block diagram of a circuit under test according to an embodiment of the present invention is shown. As shown in FIG. 5, blocks of combinatorial logic 502 and 504 receive functional inputs (functional_input). A multiplexer 506 is coupled to receive the output of the combinatorial logic block 502 and a scan input (scan_input). Accordingly, unlike a conventional circuit which registers the output of the combinatorial logic, a scan enable (scan_enable) signal coupled to a control terminal of the multiplexer 506 enables a scan input to be coupled to the register 508. Similarly, a multiplexer 510 enables the selection of the output of the combinatorial logic 504 or the output of the register 508 to be coupled to a register 512. Additional combinatorial logic 514 is coupled to receive the outputs of the registers 508 and 512. A multiplexer 516 is controlled by the scan enable signal to select the output of the combinatorial logic 514 or the output of the register 512 to be coupled to the register 518. Accordingly, when in scan test mode, faults may be identified by the application of the scan input signals and the values of the scan output as the scan input signals are clocked through the circuit.

Figure 6:
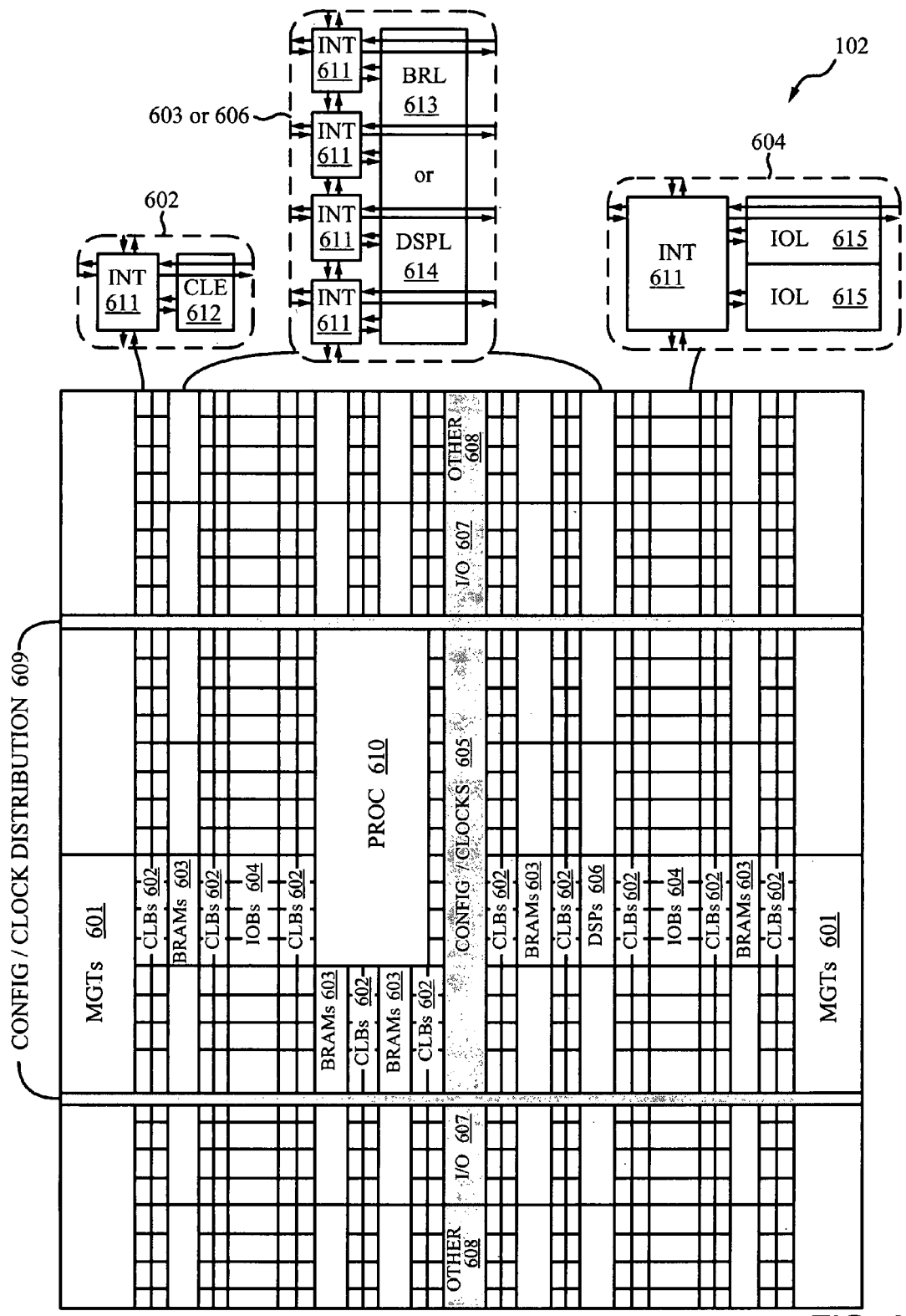
FIG. 6 is a programmable logic device according to an embodiment of the present invention.

Turning now to FIG. 6, a programmable logic device according to an embodiment of the present invention is shown. The FPGA architecture 102 of FIG. 6 includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610). According to one embodiment, the circuit of FIG. 2 may be implemented in one or more programmable logic blocks and/or other blocks of the FPGA. The circuit may then be removed from the FPGA and the resources which had been used to implement the circuit of FIG. 2 to test for faults in the FPGA may be programmed with a circuit of a user's design.

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 may include a configurable logic element (CLE 612) that may be programmed to implement user logic plus a single programmable interconnect element (INT 611). A BRAM 603 may include a BRAM logic element (BRL 613) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 606 may include a DSP logic element (DSPL 614) in addition to an appropriate number of programmable interconnect elements. An IOB 604 may include, for example, two instances of an input/output logic element (IOL 615) in addition to one instance of the programmable interconnect element (INT 611).

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA. Some FPGAs utilizing the architecture illustrated in FIG. 6 include additional logic blocks that disrupt the regular columnar structure making up a large part of the FPGA. The additional logic blocks may be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of integrated circuit having programmable logic.

Figure 7:
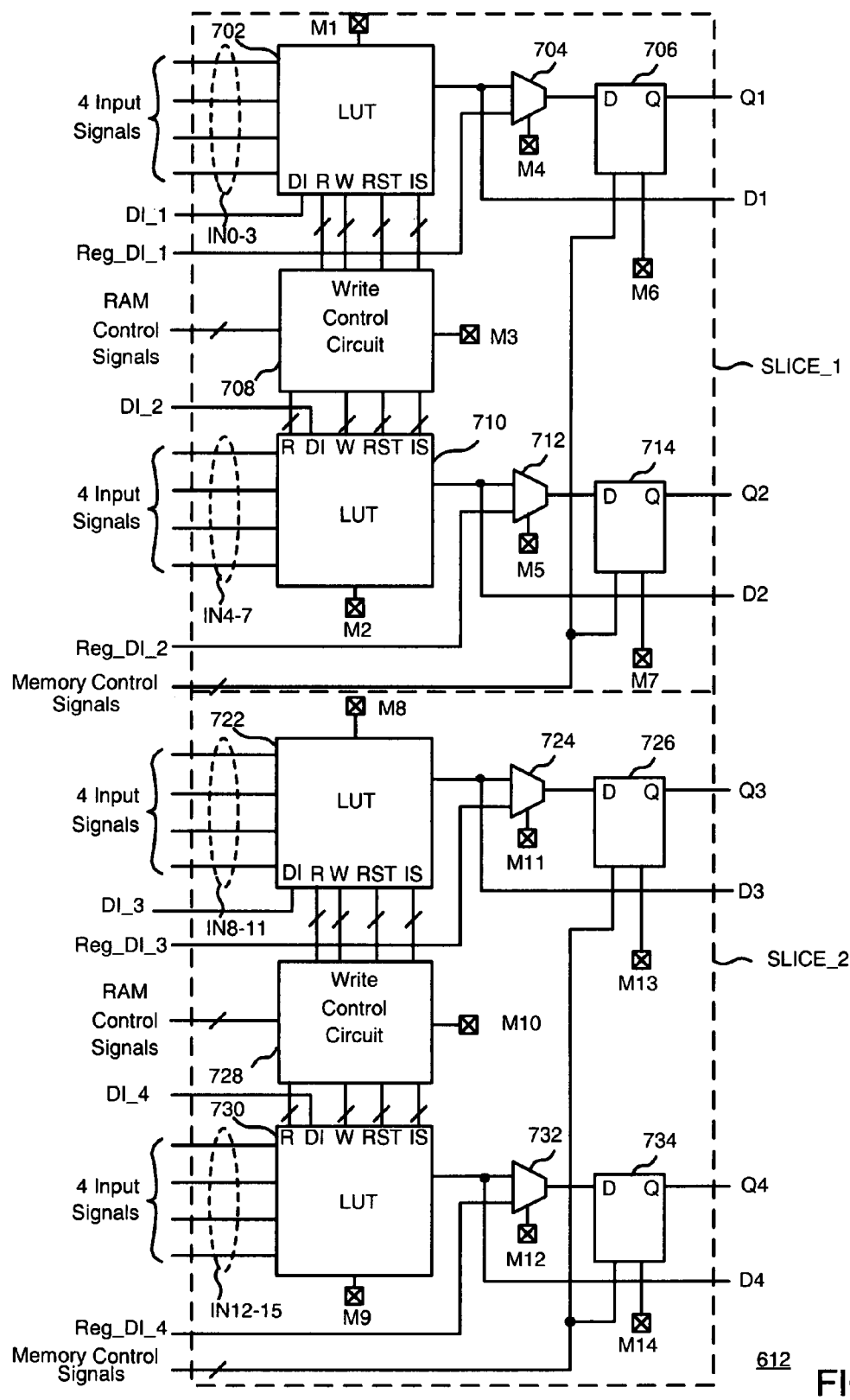
FIG. 7 is a block diagram of a configurable logic element of the programmable logic device of FIG. 6 according to an embodiment of the present invention.

Turning now to FIG. 7, a block diagram of a configurable logic element of the programmable logic device of FIG. 6 according to an embodiment of the present invention is shown. In particular, FIG. 7 illustrates in simplified form a configurable logic element of a configuration logic block 602 of FIG. 6. The configurable logic element shown comprises two similar slices, where each slice comprises a pair of function generators. However, the configurable logic element may comprise more slices, such as four slices, for example. Each function generator may function in any of several modes depending upon the configuration data in the configuration memory elements M1-M14. When in RAM mode, input data is supplied by input terminals DI_1 and DI_2 to the data input (DI) terminal of the associated function generator. Each function generator, which may comprise a lookup table (LUT), provides an output signal to an associated multiplexer, which selects between the output signal of the function generator and an associated register direct input signal Reg_DI_1 or Reg_DI_2 from the programmable interconnect element. Thus, each function generator may be optionally bypassed. When in a look-up table mode, each function generator implemented as a look-up table has four data input signals IN0-IN3. Slice 1 comprises a function generator implemented as a LUT 702 coupled to a multiplexer 704. In particular, the LUT 702 receives 4 input signals which are decoded to generate an output D1 associated with data stored in the LUT at the address designated by the input signals. The multiplexer 704 is adapted to receive the output of LUT 702 and a registered value of Reg_DI_1. The output of the multiplexer 704 is coupled to a register 706 which generates an output Q1.

A Write Control Circuit 708 is coupled to receive RAM control signals and generate signals to control the LUT 702. In addition to a data input (DI) coupled to receive DI_1 and conventional read and write control signals coupled to a read enable input (R) and a write enable input (W), respectively, the LUT 702 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. One advantage of resetting LUT memory elements of a device during partial reconfiguration is that it is not necessary to cycle through the required clock cycles to set the correct data after the partial reconfiguration. Similarly, slice 1 comprises a function generator implemented as a LUT 710 coupled to a multiplexer 712. The LUT 710 is adapted to receive input signals IN4-IN7, while the multiplexer 712 is coupled to receive the output D2 of the LUT 710 and the registered input value Reg_DI_2. The output of the multiplexer 712 is coupled to a register 714 which generates an output Q2. The write control circuit 708 also generates a partial reset signal and an initial state signal for selectively resetting or setting one or more of the bits of the LUT 710.

Similarly, slice 2 comprises a function generator implemented as a LUT 722 coupled to a multiplexer 724. The LUT 722 is adapted to receive input signals IN8-IN11, while the multiplexer 724 is coupled to receive the output of the LUT 722 and a registered input value Reg_DI_3. The output of the multiplexer 724 is coupled to a register 726 which generates an output Q3. A Write Control Circuit 728 is coupled to receive RAM control signals and generate signals to control the LUT 722. In particular, input signals IN8-IN11 are decoded to generate an output D3 associated with data stored in the LUT at the address designated by the input signals. The LUT 722 comprises a partial reset input (RST) for receiving a partial reset signal, and an initial state input (IS) for receiving an initial state signal. Similarly, slice 2 comprises a function generator implemented as a LUT 730 coupled to a multiplexer 732. The LUT 730 is adapted to receive input signals IN12-IN15, while the multiplexer 732 is coupled to receive the output D4 of the LUT 730 and a registered input value Reg_DI_4. The output of the multiplexer 732 is coupled to a register 734 which generates an output Q4. The write control circuit 728 also generates a partial reset signal and an initial state signal for selectively resetting or setting one or more of the bits of the LUT 730. As noted above, in some embodiments one or more of the LUTs 702, 710, 722, 730 may be configured in a shift register mode, and may be used to implement shift register 216.

Figure 8:
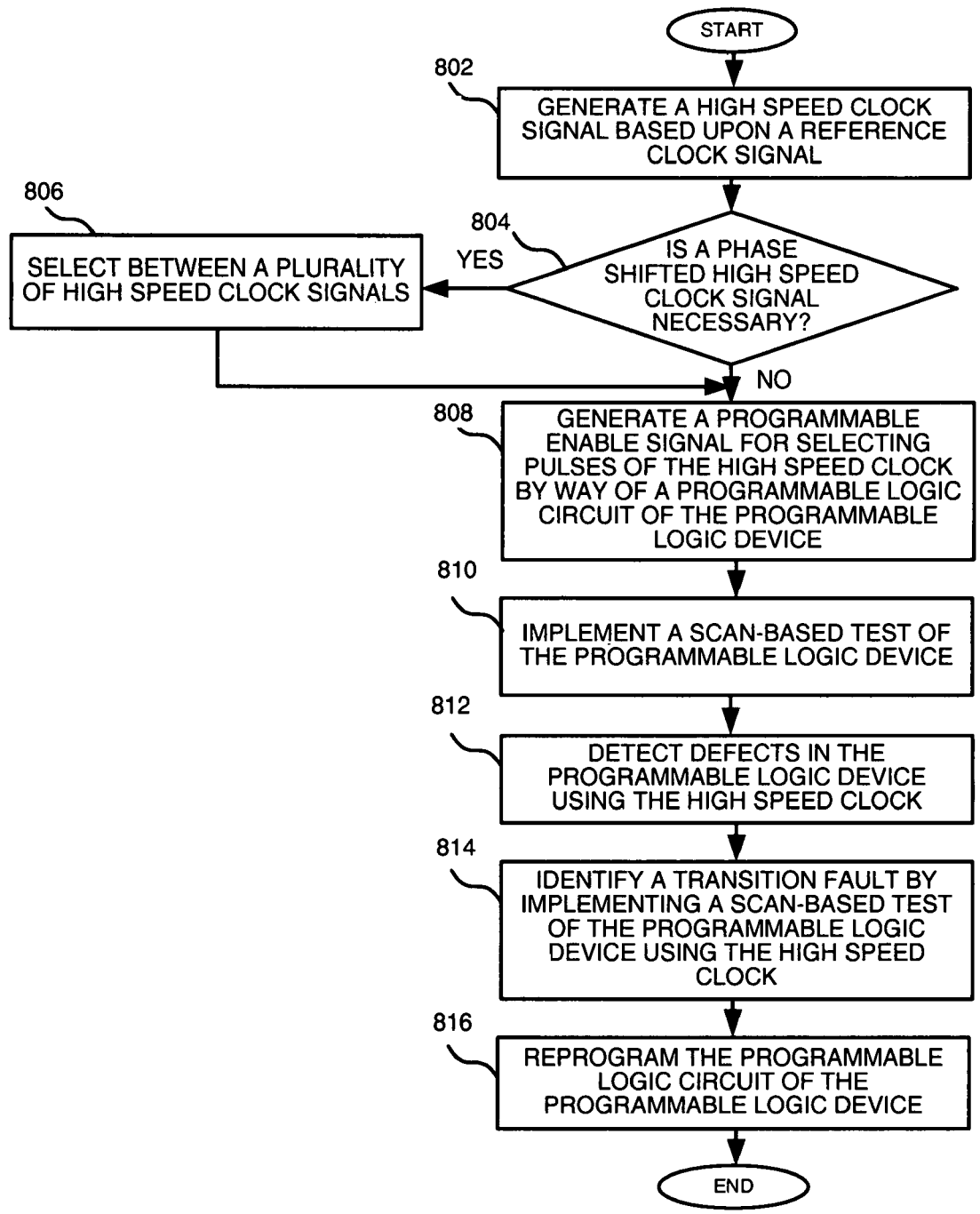
FIG. 8 is a flow chart showing a method of testing for faults in a programmable logic device according to an embodiment the present invention.

Turning now to FIG. 8, a flow chart shows a method of testing for faults in a programmable logic device according to an embodiment the present invention. In particular, a high speed clock signal is generated based upon a reference clock signal at step 802. It is then determined whether a phase shifted high speed clock signal is necessary at a step 804. If so, a selection of a high speed clock signal is made from a plurality of high speed clock signals at a step 806. A programmable enable signal is generated for selecting pulses of the high speed clock by way of a programmable logic circuit of the programmable logic device at a step 808. A scan-based test of the programmable logic device is implemented at a step 810. Defects in the programmable logic device are then detected using the high speed clock at a step 812. A transition delay fault is identified by implementing a scan-based test of the programmable logic device using the high speed clock at a step 814. The programmable logic circuit implementing the circuit for testing for faults in the programmable logic device is then reprogrammed at a step 816. The method of FIG. 8 may be implemented using any of the circuits described above in reference to FIGS. 1-7, or some other suitable circuits.

It can therefore be appreciated that the new and novel circuit for and method of testing for faults has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A circuit for testing for faults in an integrated circuit device, the circuit comprising:
    a clock generator coupled to receive a reference clock signal and generate a high speed clock signal;
    a selection circuit coupled to receive the high speed clock signal and generate selected pulses of the high speed clock signal;
    a circuit under test of the integrated circuit device coupled to receive the selected pulses of the high speed clock signal; and
    a programmable shift register coupled to receive a pulse width selection signal and generate an enable signal, wherein the enable signal controls the selection circuit, and wherein a pulse width of an active state of the enable signal is based upon a value of the pulse width selection signal.

2. The circuit of claim 1 wherein the clock generator generates a plurality of high speed clock signals based upon the reference clock signal.

3. The circuit of claim 2 wherein the selection circuit comprises a portion coupled to select one of the plurality of high speed clock signals of the clock generator.

4. The circuit of claim 1 wherein the programmable shift register is implemented in programmable logic of the integrated circuit device.

5. The circuit of claim 1 wherein the programmable shift register comprises a plurality of registers, and the pulse width of the active state of the enable signal is based upon a selection of outputs of a first register and a second register of the plurality of registers.

6. The circuit of claim 5 further comprising a first output register and a second output register respectively coupled to an output of the first register and an output of the second register of the programmable shift register.

7. The circuit of claim 1 wherein the selection circuit comprises a portion coupled to select the high speed clock signal or a scan clock signal.

8. A circuit for testing for faults in an integrated circuit device, the circuit comprising:
    a clock generator coupled to receive a reference clock signal and generate a high speed clock signal;
    a selection circuit coupled to receive the high speed clock signal and generate selected pulses of the high speed clock signal;
    a circuit under test of the integrated circuit device coupled to receive the selected pulses of the high speed clock signal; and
    a programmable circuit generating an enable signal, wherein the enable signal controls the selection circuit for selecting the selected pulses of the high speed clock signal coupled to the circuit under test, wherein the programmable circuit is reprogrammed after the circuit under test has been tested.

9. The circuit of claim 8 wherein the programmable circuit comprises a programmable shift register.

10. The circuit of claim 8 wherein the selection circuit comprises a portion coupled to select a scan clock signal or the high speed clock signal.

11. The circuit of claim 10 wherein the scan clock signal is received from test equipment.

12. The circuit of claim 8 wherein the programmable circuit performs a scan-based test on a circuit of the integrated circuit device, wherein the scan-based test is performed at the operating speed of the integrated circuit device.

13. The circuit of claim 8 further comprising a control circuit coupled to receive a pulse selection signal, wherein the pulse selection signal determines a number of the selected pulses of the high speed clock signal.

14. The circuit of claim 8 wherein the circuit under test comprises at least a portion of a programmable logic device.

15. A method of testing for faults in a programmable device, the method comprising:
    generating a high speed clock signal based upon a reference clock signal;
    generating, by a programmable circuit of the programmable device, a programmable enable signal for selecting pulses of the high speed clock signal;
    testing the programmable device using the high speed clock signal to detect defects; and
    reprogramming the programmable circuit of the programmable device with a circuit of a design to be implemented in the programmable device after the step of testing.

16. The method of claim 15 wherein generating a programmable enable signal comprises generating a signal having a pulse width to select a number of pulses of the high speed clock signal.

17. The method of claim 15 further comprising selecting the high speed clock signal from a plurality of high speed clock signals.

18. The method of claim 15 wherein testing the programmable device comprises implementing a scan-based test of the programmable device.

19. The method of claim 18 further comprising generating a test clock signal based upon a scan clock signal and the selected pulses of the high speed clock signal, wherein testing the programmable device comprises testing the programmable device using the test clock signal.

20. The method of claim 18 further comprising identifying a transition delay fault by implementing a scan-based test of the programmable device using the high speed clock signal.

* * * * *